United States Patent
Ching et al.

(10) Patent No.: US 10,121,851 B2
(45) Date of Patent: Nov. 6, 2018

(54) FIN RECESS LAST PROCESS FOR FINFET FABRICATION

(71) Applicant: Taiwan Semiconductor Manufacturing Company, Ltd., Hsin-Chu (TW)

(72) Inventors: Kuo-Cheng Ching, Zhubei (TW); Shi Ning Ju, Hsin-Chu (TW); Guan-Lin Chen, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/063,224

(22) Filed: Mar. 7, 2016

(65) Prior Publication Data

US 2016/0190242 A1 Jun. 30, 2016

Related U.S. Application Data

(62) Division of application No. 13/673,717, filed on Nov. 9, 2012, now Pat. No. 9,281,378.

(51) Int. Cl.
*H01L 21/8234* (2006.01)
*H01L 29/66* (2006.01)
(Continued)

(52) U.S. Cl.
CPC ...... *H01L 29/0649* (2013.01); *H01L 27/0886* (2013.01); *H01L 29/105* (2013.01);
(Continued)

(58) Field of Classification Search
None
See application file for complete search history.

(56) References Cited

U.S. PATENT DOCUMENTS

| 6,720,619 B1 | 4/2004 | Chen et al. |
| 6,936,516 B1 | 8/2005 | Goo et al. |

(Continued)

FOREIGN PATENT DOCUMENTS

| CN | 1992255 A | 7/2007 |
| CN | 101261991 A | 9/2008 |

(Continued)

*Primary Examiner* — Nishath Yasmeen
(74) *Attorney, Agent, or Firm* — Slater Matsil, LLP

(57) ABSTRACT

A method includes forming isolation regions extending from a top surface of a semiconductor substrate into the semiconductor substrate, and forming a hard mask strip over the isolation regions and a semiconductor strip, wherein the semiconductor strip is between two neighboring ones of the isolation regions. A dummy gate strip is formed over the hard mask strip, wherein a lengthwise direction of the dummy gate strip is perpendicular to a lengthwise direction of the semiconductor strip, and wherein a portion of the dummy gate strip is aligned to a portion of the semiconductor strip. The method further includes removing the dummy gate strip, removing the hard mask strip, and recessing first portions of the isolation regions that are overlapped by the removed hard mask strip. A portion of the semiconductor strip between and contacting the removed first portions of the isolation regions forms a semiconductor fin.

20 Claims, 8 Drawing Sheets

(51) Int. Cl.
    *H01L 29/06*     (2006.01)
    *H01L 27/088*     (2006.01)
    *H01L 29/10*     (2006.01)
    *H01L 29/161*     (2006.01)
    *H01L 29/423*     (2006.01)
    *H01L 29/78*     (2006.01)

(52) U.S. Cl.
    CPC ...... *H01L 29/161* (2013.01); *H01L 29/42364* (2013.01); *H01L 29/66545* (2013.01); *H01L 29/66795* (2013.01); *H01L 29/785* (2013.01)

(56) References Cited

U.S. PATENT DOCUMENTS

| | | | |
|---|---|---|---|
| 7,172,943 | B2 | 2/2007 | Yeo et al. |
| 7,211,864 | B2 | 5/2007 | Seliskar |
| 7,544,994 | B2 | 6/2009 | Schepis et al. |
| 7,612,405 | B2 | 11/2009 | Yu et al. |
| 7,622,773 | B2 | 11/2009 | Irisawa et al. |
| 7,651,893 | B2 | 1/2010 | Chen et al. |
| 7,714,384 | B2 | 5/2010 | Seliskar |
| 7,728,324 | B2 | 6/2010 | Tezuka et al. |
| 7,812,370 | B2 | 10/2010 | Bhuwalka et al. |
| 7,863,674 | B2 | 1/2011 | Yeo et al. |
| 7,879,675 | B2 | 2/2011 | Radosavljevic et al. |
| 7,915,112 | B2 | 3/2011 | Xu et al. |
| 7,972,914 | B2 | 7/2011 | Kim et al. |
| 8,053,299 | B2 | 11/2011 | Xu |
| 8,466,034 | B2 | 6/2013 | Maszara et al. |
| 8,466,511 | B2 | 6/2013 | Oh et al. |
| RE44,431 | E | 8/2013 | Pendse |
| 8,735,232 | B2 | 5/2014 | Baars et al. |
| 2002/0003256 | A1 | 1/2002 | Maegawa |
| 2002/0037619 | A1 | 3/2002 | Sugihara et al. |
| 2002/0072197 | A1 | 6/2002 | Kang et al. |
| 2005/0056888 | A1 | 3/2005 | Youn et al. |
| 2005/0145932 | A1 | 7/2005 | Park et al. |
| 2005/0156171 | A1* | 7/2005 | Brask ............... H01L 21/823821 257/72 |
| 2005/0224800 | A1 | 10/2005 | Lindert et al. |
| 2005/0263795 | A1 | 12/2005 | Choi et al. |
| 2007/0020879 | A1 | 1/2007 | Baek et al. |
| 2007/0045736 | A1 | 3/2007 | Yagishita |
| 2007/0063263 | A1 | 3/2007 | Oh et al. |
| 2007/0102763 | A1 | 5/2007 | Yeo et al. |
| 2007/0134884 | A1 | 6/2007 | Kim et al. |
| 2007/0210355 | A1 | 9/2007 | Izumida |
| 2007/0235819 | A1 | 10/2007 | Yagishita |
| 2008/0157172 | A1 | 7/2008 | Lee |
| 2008/0299734 | A1 | 12/2008 | Lee et al. |
| 2009/0095980 | A1 | 4/2009 | Yu et al. |
| 2009/0230483 | A1 | 9/2009 | Mizumura et al. |
| 2009/0267155 | A1 | 10/2009 | Izumida et al. |
| 2009/0315112 | A1 | 12/2009 | Lee |
| 2010/0044784 | A1* | 2/2010 | Oh ................... H01L 29/66818 257/329 |
| 2010/0052059 | A1 | 3/2010 | Lee |
| 2010/0133614 | A1 | 6/2010 | Beyer et al. |
| 2010/0163970 | A1 | 7/2010 | Rakshit et al. |
| 2010/0207208 | A1 | 8/2010 | Bedell et al. |
| 2010/0301391 | A1* | 12/2010 | Lochtefeld ........ H01L 29/66795 257/190 |
| 2011/0031552 | A1 | 2/2011 | Iwamatsu et al. |
| 2011/0095378 | A1 | 4/2011 | Lee et al. |
| 2011/0108930 | A1 | 5/2011 | Cheng et al. |
| 2011/0147811 | A1 | 6/2011 | Kavalieros et al. |
| 2011/0147828 | A1 | 6/2011 | Murthy et al. |
| 2011/0147842 | A1 | 6/2011 | Cappellani et al. |
| 2011/0171795 | A1 | 7/2011 | Tsai et al. |
| 2011/0193178 | A1 | 8/2011 | Chang et al. |
| 2011/0210404 | A1 | 9/2011 | Su et al. |
| 2011/0215375 | A1 | 9/2011 | Cook, Jr. et al. |
| 2011/0223736 | A1 | 9/2011 | Lin et al. |
| 2011/0237046 | A1* | 9/2011 | Maszara ........... H01L 29/66545 438/424 |
| 2011/0291196 | A1 | 12/2011 | Wei et al. |
| 2011/0316080 | A1 | 12/2011 | Luo et al. |
| 2012/0001266 | A1 | 1/2012 | Lim et al. |
| 2012/0074464 | A1 | 3/2012 | Cea et al. |
| 2012/0091528 | A1 | 4/2012 | Chang et al. |
| 2012/0091538 | A1 | 4/2012 | Lin et al. |
| 2012/0104472 | A1 | 5/2012 | Xu et al. |
| 2012/0161238 | A1 | 6/2012 | Scheiper et al. |
| 2012/0168817 | A1 | 7/2012 | Abou-Khalil et al. |
| 2012/0211807 | A1 | 8/2012 | Yu et al. |
| 2012/0261726 | A1 | 10/2012 | Yang et al. |
| 2012/0299100 | A1 | 11/2012 | Ota et al. |
| 2012/0319211 | A1 | 12/2012 | van Dal et al. |
| 2013/0049140 | A1 | 2/2013 | Asenov et al. |
| 2013/0099282 | A1 | 4/2013 | Chen et al. |
| 2013/0134506 | A1 | 5/2013 | Yagishita |
| 2013/0175584 | A1 | 7/2013 | Ho et al. |
| 2013/0181264 | A1 | 7/2013 | Liao et al. |
| 2013/0187206 | A1 | 7/2013 | Mor et al. |
| 2013/0200455 | A1 | 8/2013 | Lo et al. |
| 2013/0200459 | A1 | 8/2013 | Adam et al. |
| 2013/0200468 | A1 | 8/2013 | Cai et al. |
| 2013/0270628 | A1 | 10/2013 | Huang et al. |
| 2013/0285141 | A1 | 10/2013 | Kuo et al. |
| 2014/0306297 | A1 | 10/2014 | Ching et al. |
| 2014/0312398 | A1 | 10/2014 | Ching et al. |
| 2016/0043002 | A1 | 2/2016 | Kuo et al. |

FOREIGN PATENT DOCUMENTS

| | | |
|---|---|---|
| CN | 101677085 A | 3/2010 |
| KR | 20060130704 A | 12/2006 |
| KR | 20070082528 A | 8/2007 |
| KR | 20110098594 A | 9/2011 |

* cited by examiner

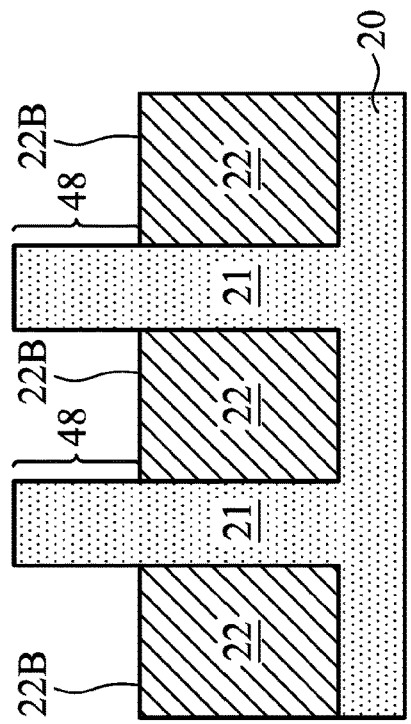
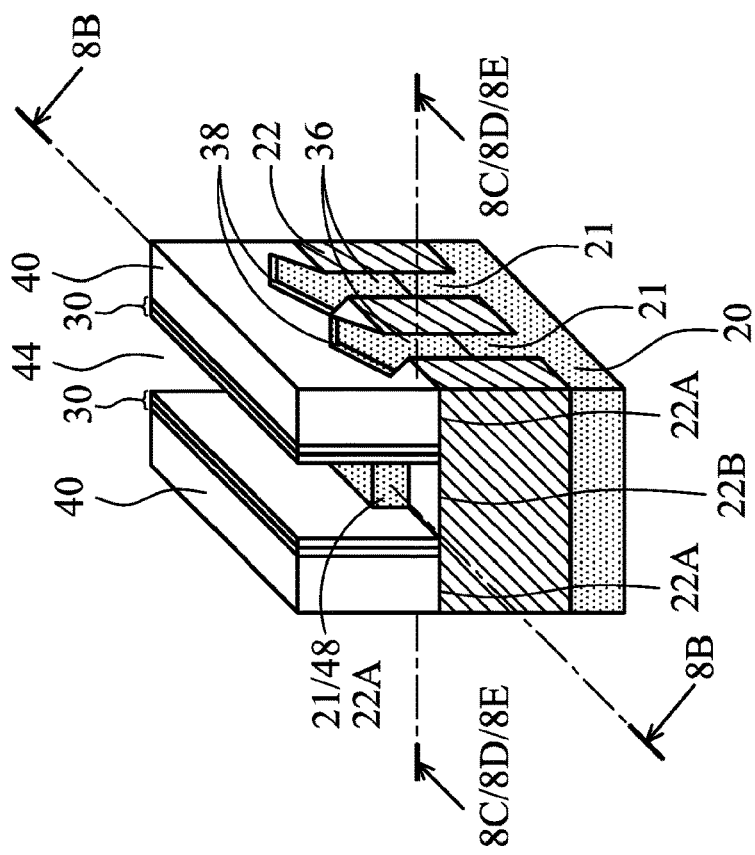
Fig. 8B
Fig. 8A

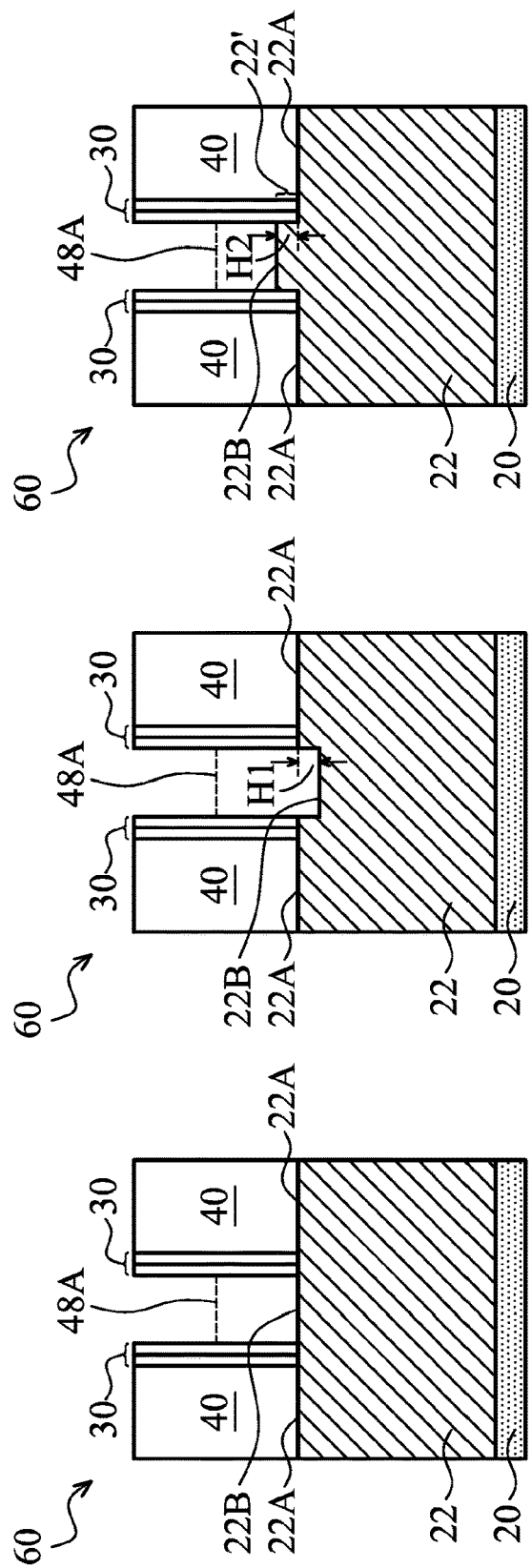

FIN RECESS LAST PROCESS FOR FINFET FABRICATION

PRIORITY CLAIM AND CROSS-REFERENCE

This application claims the benefit of the following commonly-assigned U.S. patent application Ser. No. 13/673,717, filed Nov. 9, 2012, and entitled "Fin Recess Last Process for FinFET Fabrication," and relates to the following commonly-assigned U.S. patent application Ser. No. 13/356,769, filed Jan. 24, 2012, and entitled "FinFETs and Methods for Forming the Same," which applications are hereby incorporated herein by reference.

BACKGROUND

With the increasing down-scaling of integrated circuits and increasingly demanding requirements to the speed of integrated circuits, transistors need to have higher drive currents with smaller dimensions. Fin Field-Effect Transistors (FinFETs) were thus developed. FinFETs have increased channel widths. The increase in the channel widths is achieved by forming channels that include portions on the sidewalls of semiconductor fins and portions on the top surfaces of the semiconductor fins. Since the drive currents of transistors are proportional to the channel widths, the drive currents of the FinFETs are increased.

In an existing FinFET formation process, Shallow Trench Isolation (STI) regions are first formed in a silicon substrate. The STI regions are then recessed to form silicon fins, which comprise portions of the silicon substrate that are over the recessed STI regions. Next, a gate dielectric, a gate electrode, and source and drain regions are formed to finish the formation of the FinFET.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 9D are perspective views and cross-sectional views of intermediate stages in the manufacturing of a FinFET in accordance with various exemplary embodiments.

DETAILED DESCRIPTION

Figure 1:
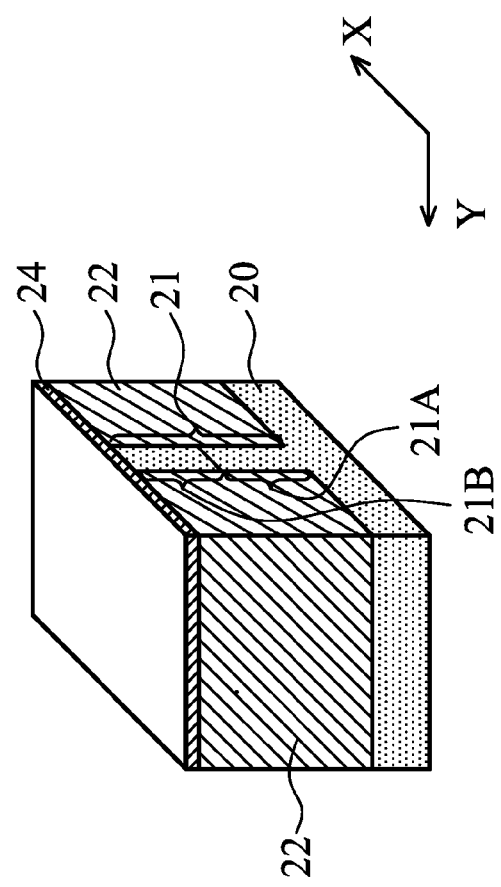

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin Field-Effect Transistor (FinFET) and the methods of forming the same are provided in accordance with various embodiments. The intermediate stages of forming the FinFET are illustrated. The variations of the embodiments are discussed. Throughout the various views and illustrative embodiments, like reference numbers are used to designate like elements.

FIGS. 1 through 9D are cross-sectional views and perspective views of intermediate stages in the manufacturing of a FinFET in accordance with some exemplary embodiments. FIG. 1 illustrates a perspective view of an initial structure. The initial structure includes substrate 20. Substrate 20 may be a semiconductor substrate, which may further be a silicon substrate, a germanium substrate, or a substrate formed of other semiconductor materials. Substrate 20 may be doped with a p-type or an n-type impurity. Isolation regions such as Shallow Trench Isolation (STI) regions 22 are formed in substrate 20 and extend from a top surface of substrate 20 into substrate 20.

Figure 3:
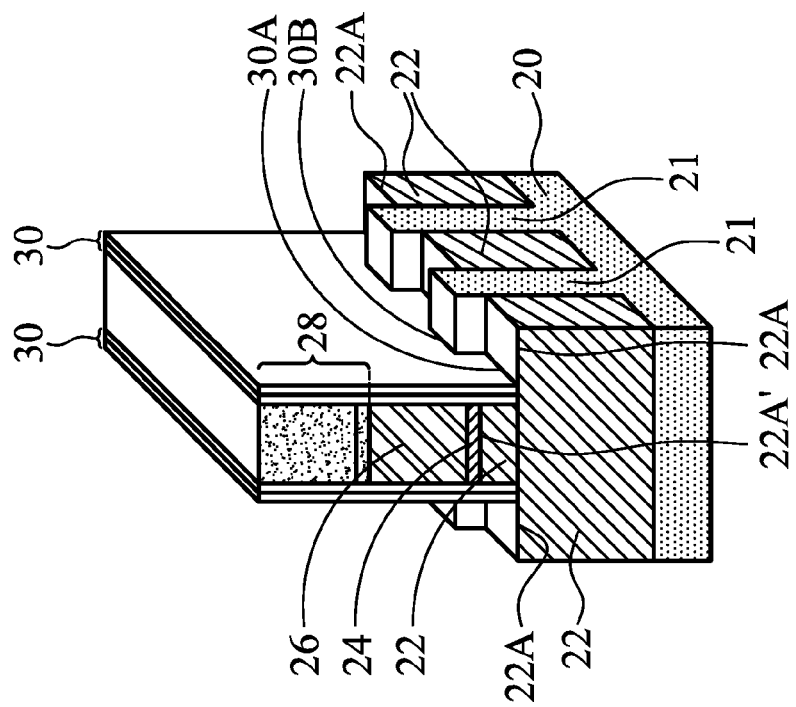

As shown in FIG. 1, semiconductor strip 21 is formed between, and contacting, neighboring STI regions 22. The longitudinal direction of semiconductor strip 21 is in the Y direction. Although one semiconductor strip 21 is shown in FIG. 1 for clarity, there may be a plurality of semiconductor strips 21 parallel to each other, as also illustrated in FIG. 3. In some exemplary embodiments, the material of semiconductor strip 21 is the same as the material of substrate 20, which may be silicon, for example. In alternative embodiments, the material of semiconductor strip 21 is different from the material of substrate 20. In some exemplary embodiments, the FinFET that is to be formed is a p-type FinFET, and semiconductor strip 21 includes relaxed silicon germanium (SiGe) region 21A and substantially pure germanium region 21B over relaxed SiGe region 21A. In alternative exemplary embodiments, the FinFET that is to be formed is an n-type MOSFET, and semiconductor strip 21 includes relaxed silicon germanium (SiGe) region 21A and substantially pure silicon region 21B over relaxed SiGe region 21A. In these embodiments, semiconductor strip 21 may be formed by etching a portion of the original substrate 20 between STI regions 22, and epitaxially growing semiconductor strip 21 between STI regions 22.

Hard mask layer 24 is formed over semiconductor strip 21 and STI regions 22. Hard mask layer 24 may be in contact with the top surfaces of STI regions 22 and semiconductor strip 21. In some embodiments, hard mask layer 24 comprises silicon nitride. In alternative embodiments, materials such as silicon oxide, silicon carbide, metal nitrides such as titanium nitride and tantalum nitride, or the like, may also be used.

Figure 2:
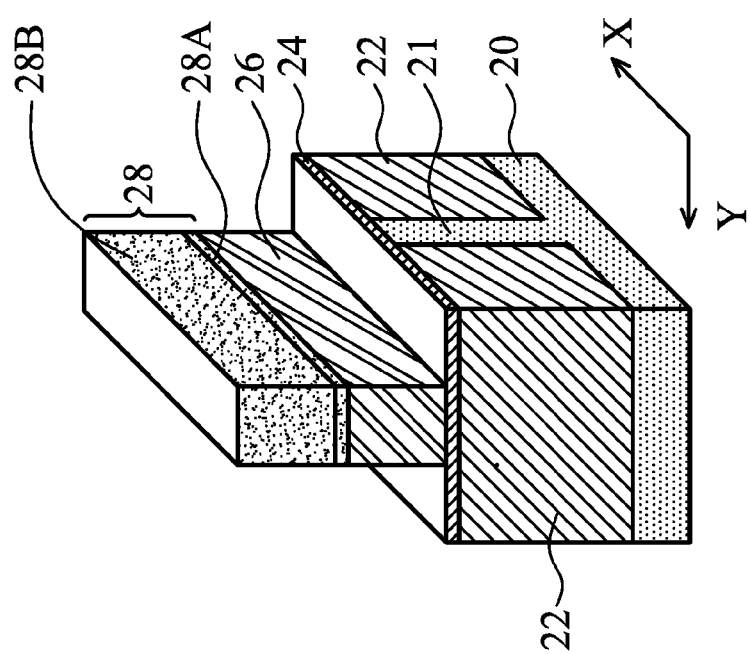

Referring to FIG. 2, polysilicon layer 26 is deposited. In accordance with some embodiments, a planarization step such as a grinding or a Chemical Mechanical Polish (CMP) is performed to level the top surface of polysilicon layer 26.

Hard mask layer 28 is then formed over polysilicon layer 26. Hard mask layer 28 may be formed of silicon nitride, for example, although other materials such as silicon oxide may also be used. In some exemplary embodiments, as shown in FIG. 2, hard mask layer 28 includes silicon nitride layer 28A and oxide layer 28B over silicon nitride layer 28A.

As also shown in FIG. 2, hard mask layer 28 is patterned. To pattern hard mask layer 28, a photo resist (not shown) may be formed and patterned first, and the patterned photo resist is used as an etching mask to pattern hard mask layer 28. The patterned photo resist is then removed. A remaining portion of hard mask layer 28 is referred to as hard mask strip 28 hereinafter. Next, hard mask strip 28 is used as an etching mask to etch the underlying polysilicon layer 26, wherein the patterning may be stopped on hard mask layer 24. A remaining portion of polysilicon layer 26 is referred to as polysilicon strip 26 hereinafter. Polysilicon strip 26 overlaps a middle portion of semiconductor strip 21, and having a longitudinal direction in X direction, which is perpendicular to the Y direction.

Figure 6:
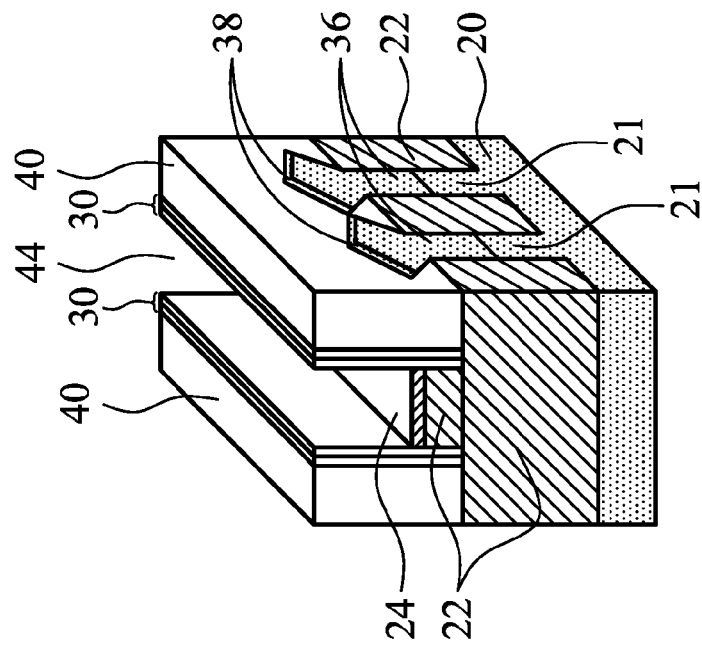

Referring to FIG. 3, hard mask strip 28 is used as an etching mask to selectively pattern hard mask layer 24. In FIG. 3, two semiconductor strips 21 are illustrated. Some portions of STI regions 22 and semiconductor strips 21 are exposed as a result of the patterning of hard mask layer 24. A first STI recessing may be performed after the patterning of hard mask layer 24. As a result of the STI recessing, top surfaces 22A of STI regions 22 are also recessed from the original top surface 22A' of STI regions. In some embodiments, the exposed portions of semiconductor strips 21 that are not covered by hard mask strip 28 are not recessed. In some embodiments, after the patterning of hard mask layer 24, and before or after the recessing of STI regions 22, hard mask strip 28 is removed. In alternative embodiments, hard mask strip 28 may be removed after some subsequent steps are performed. For example, hard mask strip 28 may be performed after the formation of Inter-Layer Dielectric (ILD) 40 (FIG. 6).

Next, as also shown in FIG. 3, gate spacers 30 are formed on the sidewalls of hard mask strip 28, polysilicon strip 26, and the sidewalls of some un-recessed portions of STI regions 22. Gate spacers 30 are formed of dielectric materials. Gate spacers 30 comprise first bottom surfaces 30A landing on the top surfaces 22A of STI regions 22, and second top surfaces 30B landing on the top surfaces of semiconductor strips 21. Since top surfaces 22A of the recessed STI regions 22 are lower than the top surfaces of semiconductor strips 21, first bottom surfaces 30A are lower than the second bottom surfaces 30B.

Figure 4:
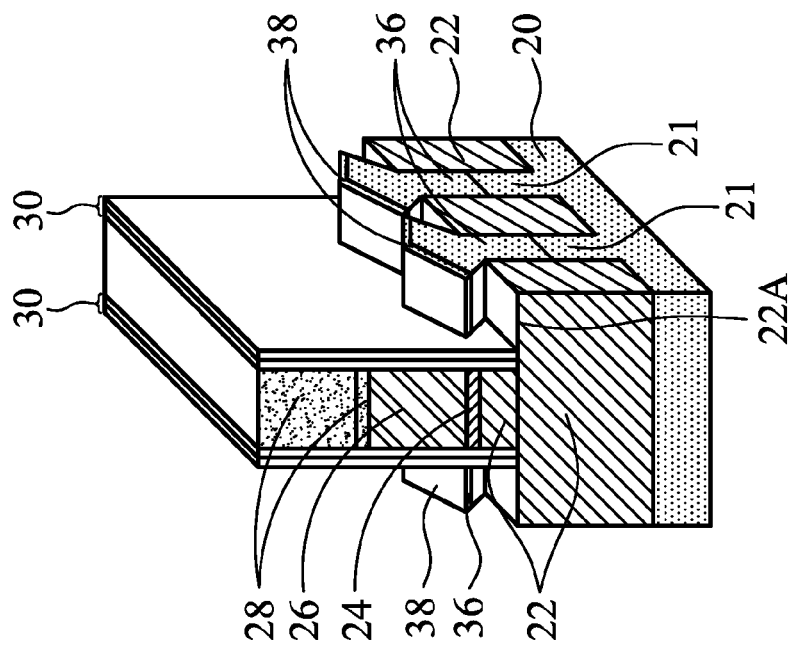

Referring to FIG. 4, after the formation of gate spacers 30, exposed portions of semiconductor strip 21 are recessed, for example, using anisotropic etching. In some embodiments, portions of semiconductor strips 21 above the exposed top surface 22A of STI regions 22 are etched. The etching of semiconductor strips 21 may be continued until the top surfaces of semiconductor strips 21 are lower the top surfaces 22A of STI regions 22, forming recesses 32 in STI regions 22. Recesses 32 include portions that on opposite sides of polysilicon strip 26.

Figure 5:
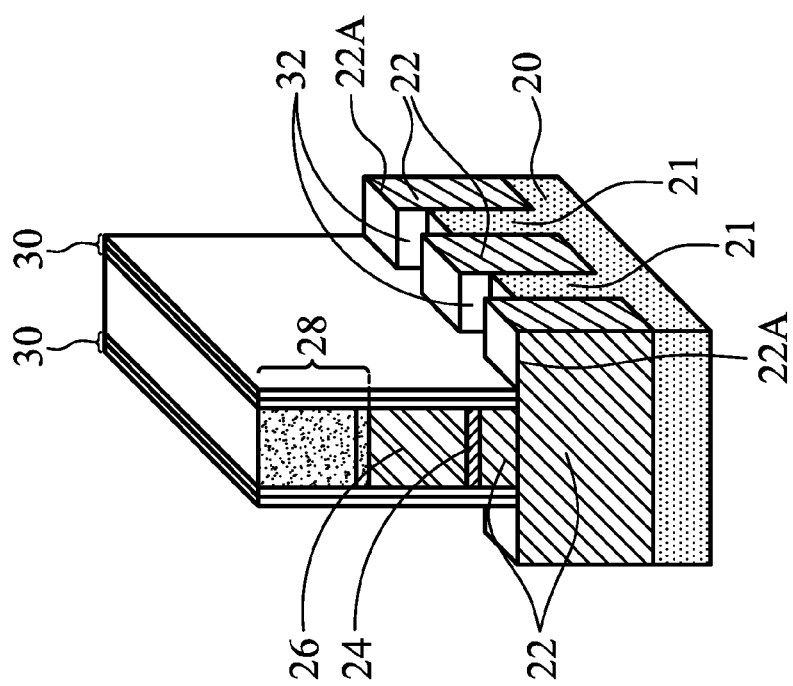

Next, as shown in FIG. 5, epitaxy regions 36 are formed by selectively growing epitaxy regions 36 from recesses 32 (FIG. 4). In some exemplary embodiments, epitaxy regions 36 comprise silicon germanium or silicon carbon. Alternatively, epitaxy regions 36 are formed of silicon. After recesses 32 are filled with epitaxy regions 36, the further epitaxial growth of epitaxy regions 36 causes epitaxy regions 36 to expand horizontally, and facets start to form.

Furthermore, some of top surfaces 22A of STI regions 22 are underlying some portions of epitaxy regions 36 due to the horizontal growth of epitaxy regions 36. After the epitaxy step, epitaxy regions 36 may be implanted to form source and drain regions, which are also denoted using reference numeral 36. Source and drain regions 36 are on opposite sides of polysilicon strip 26, and may be overlying and overlapping portions of surfaces 22A of STI regions 22. Following the formation of source and drain regions 36, source and drain silicide regions 38 may be formed by siliciding the top portions of epitaxy regions 36. In alternative embodiments, source and drain silicide regions 38 are formed after the formation of replacement gate electrode 52 (FIGS. 9A-9D).

FIG. 6 illustrates the formation of Inter-Layer Dielectric (ILD) 40. In some embodiments, ILD 40 includes carbon-containing oxides, silicate glass, or other dielectric materials. ILD 40 may be filled until its top surface is higher than the top surface of polysilicon strip 26, or higher than hard mask strip 28 (note shown in FIG. 6, please refer to FIGS. 3 and 4). A CMP is then performed to remove excess ILD 40. In some embodiments, polysilicon strip 26 is used as a CMP stop layer, so that the top surfaces of ILD 40 is level with the top surfaces of polysilicon strips 26. In alternative embodiments, hard mask strip 28 (FIG. 3) may also be used as a CMP stop layer. In the embodiments wherein hard mask strip 28 is used as the CMP stop layer, after the CMP, an etching step may be performed to remove hard mask strip 28.

Figure 7:
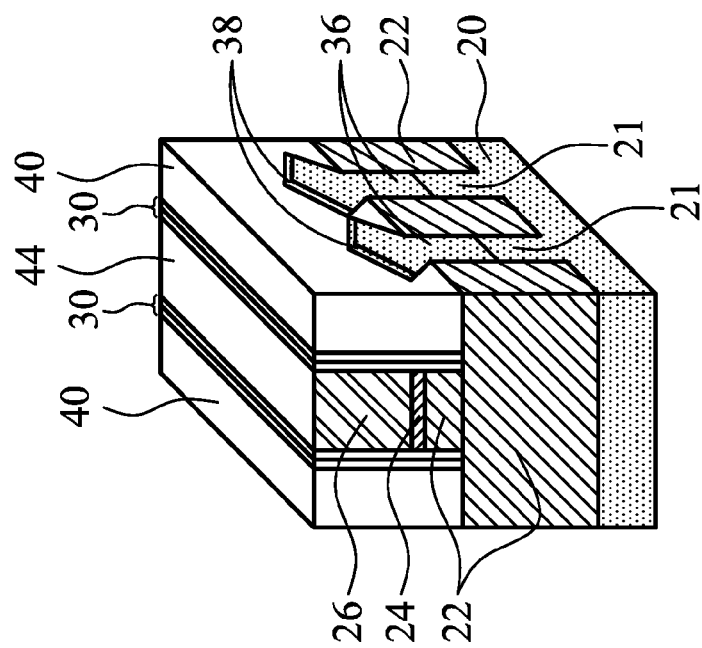

Next, referring to FIG. 7, polysilicon strip 26 is removed in an etching step, so that recess 44 is formed between opposite gate spacers 30. Hard mask layer 24 is thus exposed. Since polysilicon strip 26 is not in the final structure, polysilicon strip 26 is referred to as a dummy polysilicon strip throughout the description.

After the removal of dummy polysilicon strip 26, hard mask layer 24 is removed. The resulting structure is shown in FIG. 8A. After the removal of hard mask layer 24, the portions of STI regions 22 underlying the removed hard mask layer 24 are recessed in a second recessing step, which may be a selective etching step, so that recess 44 extends downwardly. The top surfaces the recessed STI regions 22 are also recessed from the original surfaces 22A' (FIG. 3) to top surfaces 22B. As a result, STI regions 22 have top surfaces 22B generated by the etching step. During the selective etching, semiconductor strips 21 are not etched, and the portions of semiconductor strips 21 over top surface 22B form semiconductor fins 48.

FIG. 8B illustrates a cross-sectional view of the structure in FIG. 8A, wherein the cross-sectional view is obtained from the plane crossing line 8B-8B in FIG. 8A. Semiconductor fins 48 are illustrated in FIG. 8B.

FIGS. 8C, 8D, and 8E illustrate cross-sectional views of the structure in FIG. 8A in accordance various embodiments, wherein the cross-sectional views are obtained from the plane crossing line 8C/8D/8E-8C/8D/8E in FIG. 8A. In some embodiments, as illustrated in FIGS. 8C and 8A, top surfaces 22B are level with top surfaces 22A of STI regions 22. In alternative embodiments, as shown in FIG. 8D, top surfaces 22B are lower than top surfaces 22A of STI regions 22. In yet alternative embodiments, as shown in FIG. 8E, top surfaces 22B are higher than top surfaces 22A of STI regions 22. In FIG. 8E, portions 22' of STI regions 22 are located between opposite gate spacers 30, and the sidewalls of portions 22' are in contact with the sidewalls of gate spacers 30. Top surfaces 48A of semiconductor fins 48 are illustrated using a dashed line in FIGS. 8C, 8D, and 8E since semiconductor fin 48 is not in the planes illustrated in FIGS. 8C, 8D, and 8E.

Figure 9A:
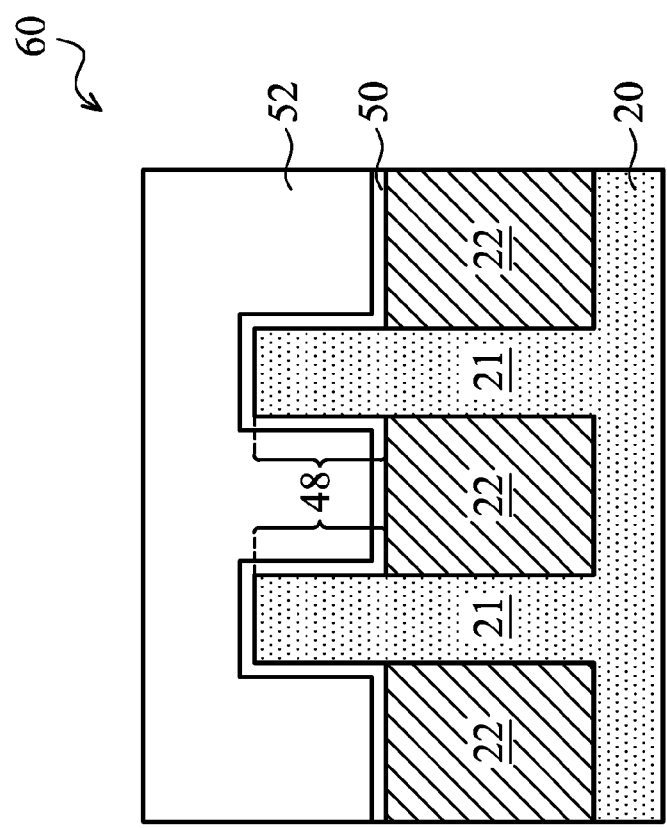
Figures 9B, 9C, 9D:
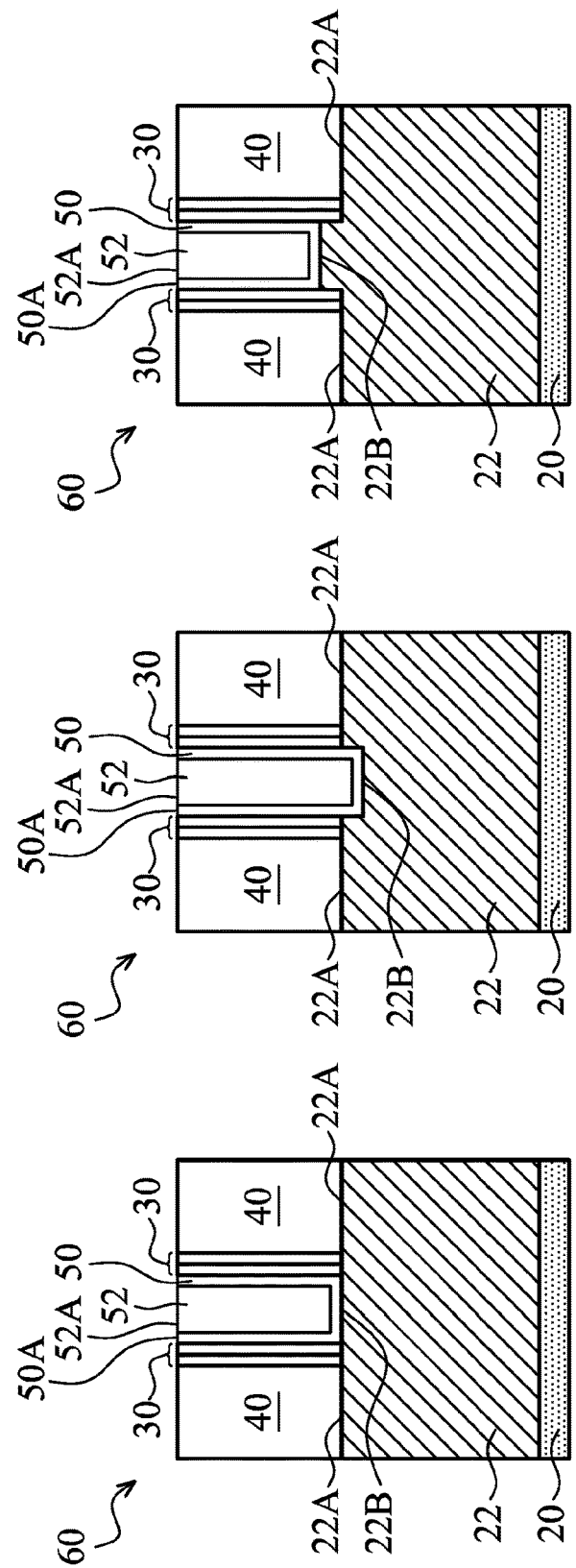

FIGS. 9A and 9B illustrate the formation of gate dielectric layer 50 and gate electrode 52. The cross-sectional view in FIG. 9A is obtained from the same plane that crosses lines 8B-8B in FIG. 8A. First, gate dielectric layer 50 is formed in recess 44 (FIG. 8A) and on the top surfaces and the sidewalls of semiconductor fins 48. In accordance with some embodiments, gate dielectric layer 50 comprises silicon oxide, silicon nitride, or multilayers thereof. In alternative embodiments, gate dielectric layer 50 comprises a high-k dielectric material, and hence is alternatively referred to as high-k gate dielectric layer 50 throughout the description. High-k gate dielectric layer 50 may have a k value greater than about 7.0, and may include a metal oxide or a silicate of Hf, Al, Zr, La, Mg, Ba, Ti, Pb, and combinations thereof. The formation methods of gate dielectric layer 50 may include Molecular-Beam Deposition (MBD), Atomic Layer Deposition (ALD), Physical Vapor Deposition (PVD), and the like.

Next, conductive material 52 is formed over gate dielectric layer 50, and fills the remaining recess 44 (FIG. 8A). Conductive material 52 may comprise a metal-containing material such as TiN, TaN, TaC, Co, Ru, Al, combinations thereof, and multi-layers thereof. The work function of conductive material 52 may be, or may not be, a band-edge work function, depending on whether the respective FinFET is a p-type FinFET or an n-type FinFET. After the filling of conductive material 52, a CMP may be performed to remove the excess portions of gate dielectric layer 50 and conductive material 52 over the top surface of ILD 40. The resulting remaining portions of the conductive material and gate dielectric layer 50 thus form the replacement gate, which includes gate electrode 52 and gate dielectric 50, respectively, of the resulting FinFET 60.

The cross-sectional views in FIGS. 9B, 9C, and 9D are obtained in accordance with various embodiments, and are obtained from the same plane that crosses line 8C/8D/8E-8C/8D/8E in FIG. 8A. Furthermore, FinFETs 60 in FIGS. 9B, 9C, and 9D are obtained from the structures in FIGS. 8C, 8D, and 8E, respectively. Referring to FIGS. 9B, 9C, and 9D, due to the replacement-gate formation process, top edge 50A of gate dielectric 50 is level with top edge 52A of gate electrode 52. In subsequent process steps, an additional ILD (not shown) may be formed over ILD 40, and contact plugs (not shown) may be formed to penetrate through the additional ILD and the underlying ILD 40 to electrically couple to gate electrode 52 and silicide regions 38 (FIG. 6). The formation of FinFET 60 is thus finished.

The FinFETs 60 in accordance with embodiments have replacement gates. By recessing STI regions to form semiconductor fins after the formation of source and drain regions, there is no need to form dummy oxides to cover the fins of core FinFETs when Input/output (IO) devices are formed. The profile of the semiconductor fins are thus not prone to the damage caused by the formation and the removal of the dummy oxides.

It is observed that in the resulting FinFET 60, the portions of STI regions 22 that are on the opposite sides of a same gate electrode 52 (FIGS. 9B, 9C, and 9D) have top surfaces 22A that are either higher than, level with, or lower than, top surface 22B that are underlying (and aligned to) gate electrode 52. This is different from the conventional FinFETs. In the conventional FinFETs, the STI regions 22 that are on the opposite sides of a gate electrode have top surfaces that are level with the top surface of the portion of the STI region that is underlying (and aligned to) the gate electrode.

In accordance with embodiments, a method includes forming isolation regions extending from a top surface of a semiconductor substrate into the semiconductor substrate, and forming a hard mask strip over the isolation regions and a semiconductor strip, wherein the semiconductor strip is between two neighboring ones of the isolation regions. A dummy gate strip is formed over the hard mask strip, wherein a lengthwise direction of the dummy gate strip is perpendicular to a lengthwise direction of the semiconductor strip, and wherein a portion of the dummy gate strip is aligned to a portion of the semiconductor strip. The method further includes removing the dummy gate strip, removing the hard mask strip, and recessing first portions of the isolation regions that are overlapped by the removed hard mask strip. A portion of the semiconductor strip between and contacting the removed first portions of the isolation regions forms a semiconductor fin.

In accordance with other embodiments, a method includes forming a hard mask layer over isolation regions and a semiconductor strip, wherein the isolation regions extend from a top surface of a semiconductor substrate into the semiconductor substrate, and wherein the semiconductor strip is between the isolation regions. The method further includes forming a hard mask strip over the isolation regions and the semiconductor strip, forming a dummy gate strip over the hard mask strip, and performing a first recessing to recess first portions of the isolation regions, wherein the first recessing has a first recessing depth. The first portions of the isolation regions are on opposite sides of the dummy gate strip. After the first recessing, the dummy gate strip is removed, and the hard mask strip is removed. A second recessing is performed to recess second portions of the isolation regions that are overlapped by the removed dummy gate strip. The second recessing has a second recessing depth, wherein a portion of the semiconductor strip between and contacting the second portions of the isolation regions forms a semiconductor fin.

In accordance with yet other embodiments, a FinFET includes a semiconductor fin, a gate dielectric on sidewalls of the semiconductor fin, a gate electrode over the gate dielectric, wherein the gate dielectric and the gate electrode form a replacement gate, and gate spacers on opposite sides of the gate dielectric and the gate electrode. The gate dielectric includes a portion between and contacting the gate electrode and one of the gate spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
isolation regions; and
a Fin Field-Effect Transistor (FinFET) comprising:

a semiconductor fin between two opposite portions of the isolation regions, wherein the semiconductor fin protrudes higher than top surfaces of the isolation regions;
a gate dielectric on sidewalls of the semiconductor fin;
a gate electrode over the gate dielectric; and
a gate spacer on a sidewall of the gate dielectric, wherein a portion of the gate spacer is at a same level as a portion of the semiconductor fin, wherein the gate dielectric comprises a portion between and contacting the gate electrode and the gate spacer, and wherein a bottom surface of the gate dielectric is higher than a bottom surface of the gate spacer.

2. The device of claim 1 further comprising an isolation region comprising:
a first portion overlapped by a portion of the gate electrode, wherein the gate dielectric contacts a first top surface of the first portion of the isolation region; and
a second portion on a side of, and physically joined to, the first portion, wherein a second top surface of the second portion of the isolation region is higher than the first top surface of the first portion of the isolation region.

3. The device of claim 1 further comprising an isolation region comprising:
a first portion overlapped by a portion of the gate electrode, wherein the gate dielectric contacts a first top surface of the first portion of the isolation region; and
a second portion on a side of, and physically joined to, the first portion, wherein a second top surface of the second portion of the isolation region is lower than the first top surface of the first portion of the isolation region.

4. The device of claim 3, wherein the gate spacer comprises a first bottom surface contacting the second top surface of the second portion of the isolation region.

5. The device of claim 3, wherein the gate spacer further comprises a second bottom surface contacting a top surface of the semiconductor fin.

6. The device of claim 3, wherein the gate spacer comprises a sidewall contacting a sidewall of the first portion of the isolation region.

7. The device of claim 3 further comprising an Inter-Layer Dielectric (ILD), wherein a bottom portion of the ILD is lower than a bottommost surface of the gate dielectric.

8. The device of claim 3 further comprising an Inter-Layer Dielectric (ILD), wherein a portion of the ILD is lower than a top portion of the first portion of the isolation region.

9. The device of claim 1, wherein the semiconductor fin comprises a relaxed silicon germanium region, and an additional semiconductor region over the relaxed silicon germanium region, and wherein the additional semiconductor region has a germanium percentage different from a germanium percentage in the relaxed silicon germanium region.

10. The device of claim 9, wherein the germanium percentage of the additional semiconductor region is higher than the germanium percentage in the relaxed silicon germanium region.

11. A device comprising:
a Fin Field-Effect Transistor (FinFET) comprising:
a semiconductor fin;
an isolation region on a side of the semiconductor fin, wherein the semiconductor fin is higher than the isolation region;
a gate dielectric on sidewalls and a top surface of the semiconductor fin, wherein the gate dielectric overlaps the isolation region;
a gate electrode over a bottom portion of the gate dielectric, wherein a sidewall of the gate electrode contacts a sidewall portion of the gate dielectric; and
a gate spacer comprising:
a first portion laterally overlapping the semiconductor fin; and
a second portion laterally overlapping the isolation region, wherein a sidewall of the second portion of the gate spacer is in physical contact with a sidewall of the isolation region, and a bottom surface of the second portion of the gate spacer is lower than a top surface of the isolation region.

12. The device of claim 11 further comprising an Inter-Layer Dielectric (ILD) contacting the gate spacer, wherein the ILD extends lower than a bottommost surface of the gate dielectric.

13. The device of claim 11 further comprising an Inter-Layer Dielectric (ILD) contacting the gate spacer, wherein a portion of the ILD is lower than the top surface of the isolation region.

14. A device comprising:
a Fin Field-Effect Transistor (FinFET) comprising:
a semiconductor fin;
an isolation region on a side of the semiconductor fin, wherein the semiconductor fin is higher than the isolation region, and the isolation region comprises a first portion and a second portion;
a gate dielectric on sidewalls and a top surface of the semiconductor fin, wherein the gate dielectric overlaps the first portion of the isolation region, and a sidewall of a sidewall portion of the gate dielectric contacts a sidewall of the second portion of the isolation region;
a gate electrode over a bottom portion of the gate dielectric, wherein a sidewall of the gate electrode contacts the sidewall portion of the gate dielectric; and
a gate spacer comprising:
a first portion overlapping the semiconductor fin; and
a second portion overlapping the second portion of the isolation region, and
an Inter-Layer Dielectric (ILD) contacting the gate spacer, wherein a top surface of the first portion of the isolation region is higher than a bottom surface of a portion of the ILD.

15. The device of claim 14, wherein a bottom surface of the second portion of the gate spacer is higher than a top surface of the first portion of the isolation region.

16. The device of claim 14, wherein a portion of the gate electrode is lower than a top portion of the second portion of the isolation region.

17. The device of claim 14, wherein a portion of the gate dielectric is lower than a bottom surface of the ILD.

18. The device of claim 14, wherein a bottom end of the gate spacer is level with a bottom surface of the ILD.

19. The device of claim 1, wherein a top surface of the gate dielectric is level with a top surface of the gate spacer.

20. The device of claim 11, wherein a top surface of the gate dielectric is level with a top surface of the gate spacer.

* * * * *